US008896362B2

(12) United States Patent
Chen (10) Patent No.: US 8,896,362 B2
(45) Date of Patent: Nov. 25, 2014

(54) CONTROL CIRCUIT FOR CONTROLLING A PUSH-PULL CIRCUIT AND METHOD THEREOF

(71) Applicant: Realtek Semiconductor Corp., HsinChu (TW)

(72) Inventor: Leaf Chen, Kaohsiung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/045,772

(22) Filed: Oct. 3, 2013

(65) Prior Publication Data

US 2014/0203861 A1    Jul. 24, 2014

(30) Foreign Application Priority Data

Jan. 21, 2013  (TW) .............................. 102102222 A (51) Int. Cl.
*H03K 17/284*  (2006.01)
(52) U.S. Cl.
CPC .................................. *H03K 17/284* (2013.01)
USPC .............. 327/399; 327/387; 327/108; 327/83
(58) Field of Classification Search
USPC ......... 327/399, 387, 239, 259, 333, 108–112, 327/291–299, 261–264, 269–272, 276–278, 327/284, 285, 217, 199; 326/82, 83
See application file for complete search history.

(56) References Cited

U.S. PATENT DOCUMENTS 8,552,768 B2 * 10/2013 Lee et al. ....................... 327/108
2006/0001459 A1 * 1/2006 Audy ............................. 327/112

* cited by examiner

*Primary Examiner* — Lincoln Donovan
*Assistant Examiner* — Thomas Skibinski
(74) *Attorney, Agent, or Firm* — Winston Hsu; Scott Margo (57) ABSTRACT

A control circuit for generating a first control signal and a second control signal includes: an inverter, used for generating an inverted clock according to an input clock; a first delay circuit, used for generating a first delay control signal; a second delay circuit, used for generating a second delay control signal; a first mask circuit, used for generating a first mask signal according to the input clock; a second mask circuit, used for generating a second mask signal according to the inverted input clock; a first logic determining circuit, used for generating the first control signal to the first delay circuit according to the second mask signal and the input clock; and a second logic determining circuit, used for generating the second control signal to the second delay circuit according to the first mask signal and the inverted clock.

9 Claims, 11 Drawing Sheets

FIG. 11

CONTROL CIRCUIT FOR CONTROLLING A PUSH-PULL CIRCUIT AND METHOD THEREOF

BACKGROUND OF THE INVENTION

1. Field of the Invention

The disclosed embodiments of the present invention relate to push-pull circuits, and more particularly, to a control circuit for controlling a push-pull circuit which prevents complementary transistors therein from turning on at the same time, and a control method thereof.

2. Description of the Prior Art

A push-pull circuit includes a pair of complementary transistors for outputting the corresponding voltage level via appropriate control of the transistor switches. Regarding a pair of MOSFETs, when the high-side transistor is turned on and the low-side transistor is cut off, the high voltage level will be output. When the high-side transistor is cut off and the low-side transistor is turned on, the low voltage level will be output. Therefore, the push-pull circuit has the functions of providing a sink current and a source current, which can be utilized for current driving.

SUMMARY OF THE INVENTION

Thus, one of the objectives of the present invention is to provide a control circuit for controlling the push-pull circuit and a related control method to solve the problem mentioned above.

According to a first embodiment of the present invention, a control circuit for generating a first control signal and a second control signal is disclosed. The control circuit comprises an inverter, a first delayed clock, a second delayed clock, a first mask circuit, a second mask circuit, a first logic determining circuit, and a second logic determining circuit. The inverter is arranged for inverting an input clock to generate an inverted clock. The first delayed clock is arranged for delaying the first control signal to generate a first delay control signal. The second delayed clock is arranged for delaying the second control signal to generate a second delay control signal. The first mask circuit is coupled to the first delay circuit and the input clock, and arranged for filtering out the first delay control signal not larger than a first time period to generate a first mask signal according to the input clock. The second mask circuit is coupled to the second delay circuit and the inverted input clock, and arranged for filtering out the second delay control signal not larger than a second time period to generate a second mask signal according to the inverted input clock. The first logic determining circuit is arranged for generating the first control signal to the first delay circuit according to the second mask signal and the input clock. The second logic determining circuit is arranged for generating the second control signal to the second delay circuit according to the first mask signal and the inverted input clock.

According to a second embodiment of the present invention, a control method for generating a first control signal and a second control signal is disclosed. The control method comprises: inverting an input clock to generate an inverted clock; delaying the first control signal to generate a first delay control signal; delaying the second control signal to generate a second delay control signal; filtering out the first delay control signal not larger than a first time period to generate a first mask signal according to the input clock; filtering out the second delay control signal not larger than a second time period to generate a second mask signal according to the inverted input clock; generating the first control signal to the first delay circuit according to the second mask signal and the input clock; and generating the second control signal to the second delay circuit according to the first mask signal and the inverted input clock.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
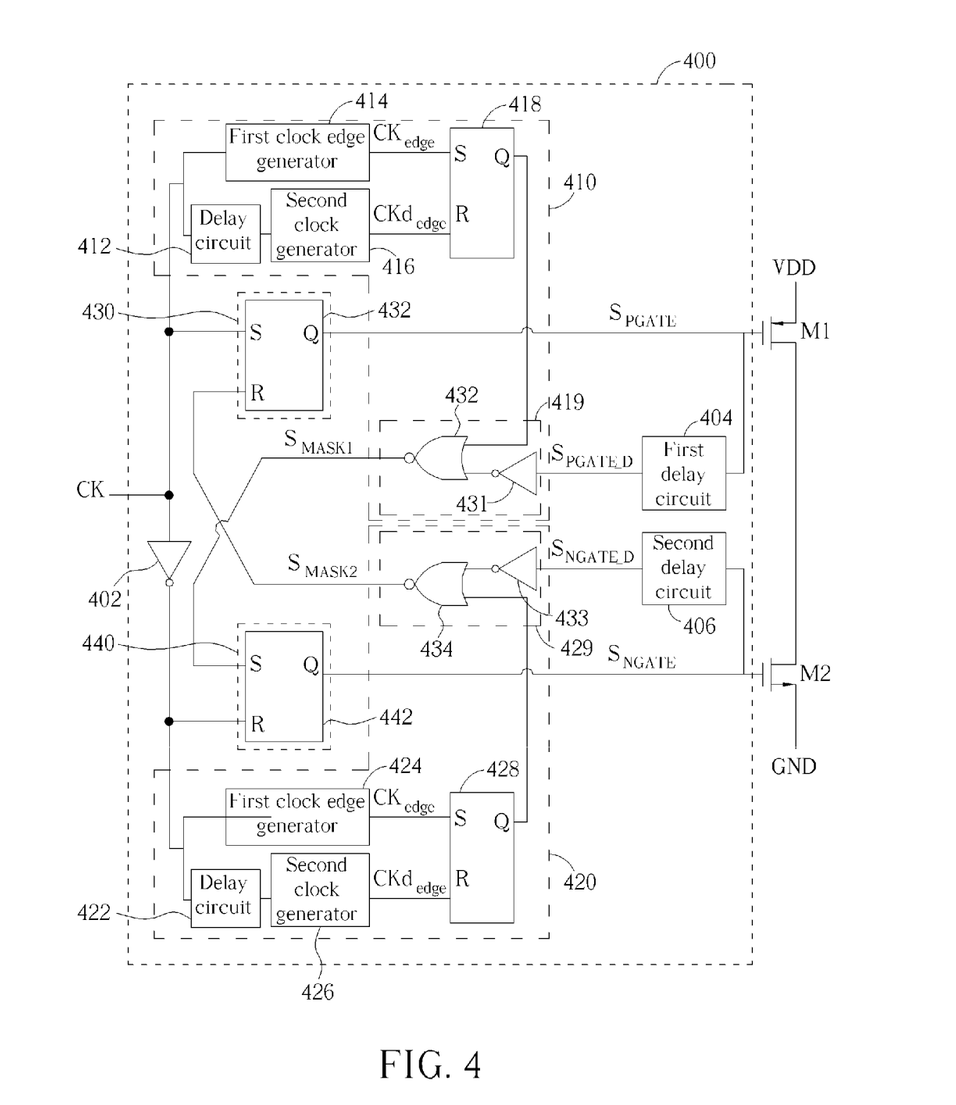
FIG. 4 is a diagram illustrating a control circuit for generating a first control signal and a second control signal according to an exemplary embodiment of the present invention.

Please refer to FIG. 4, which is a diagram illustrating a control circuit 400 for generating a first control signal and a second control signal according to an exemplary embodiment of the present invention. The control circuit 400 may be applied to control a push-pull circuit; however, this is not a limitation. Any other alternative designs employing the control circuit 400 all belong to the scope of the present invention. In FIG. 4, an input clock CK is inputted to an input terminal of the control circuit 400, in addition, a first control signal $S_{PGATE}$ and a second control signal $S_{NGATE}$ are outputted from a first output terminal and a second output terminal of the control circuit 400 respectively to the gate of a P-type transistor M1 and the gate of an N-type transistor. It should be noted that the high side component and the low side component connected to the push-pull circuit are not necessarily a P-type transistor and an N-type transistor respectively. The high side component may be an N-type transistor, and the low side component may be a P-type transistor. Moreover, the first control signal $S_{PGATE}$ and the second control signal $S_{NGATE}$ may be inverted first (e.g. by an inverter) and then outputted to the corresponding transistor or circuit unit.

In this embodiment, the control circuit 400 includes an inverter 402, a first delay circuit 404, a second delay circuit 406, a first mask circuit 410, a second mask circuit 420, a first logic determining circuit 430, and a second logic determining circuit 440. The inverter 402 is utilized for inverting the input clock CK to generate an inverted input clock CKB. The first delay circuit 404 is utilized for delaying the first control signal $S_{PGATE}$ to generate a first delay control signal $S_{PGATE\_D}$, the second delay circuit 406 is utilized for delaying the second control signal $S_{NGATE}$ to generate a second delay control signal $S_{NGATE\_D}$, wherein the delay time of the first delay circuit 404 is larger than the delay time of the P-type transistor M1, and the delay time of the second delay circuit 406 is larger than the delay time of the N-type transistor M2. This ensures one of the transistors completes the turn on or cut off operation when it receives a signal of the other transistor. The delay time of the first delay circuit 404 and the delay time of the second delay circuit 406 may be configured to be the same time period. For instance, the same time period may be larger than the largest delay time of the P-type transistor and the N-type transistor.

The first mask circuit 410 of the control circuit 400 is coupled to the first delay circuit 404 and the input clock CK, and the first mask circuit 410 is utilized for filtering out the first delay control signal $S_{PGATE\_D}$, which is not larger than a first time period td1, to generate a first mask signal $S_{MASK1}$ according to the input clock CK. The first mask circuit 410 includes a delay circuit 412, a first clock edge generator 414, a second clock generator 416, a SR latch 418, and a logic circuit 419, wherein the delay circuit 412 is utilized to delay the input clock CK the first time period td1 to generate a delayed clock CKd. The first clock edge generator 414 is utilized for generating a first clock edge signal $CK_{edge}$ according to specific clock edges of the input clock CK (e.g. the positive edges of the input clock CK). The second clock edge generator 416 is utilized for generating a second clock edge signal $CKd_{edge}$ according to specific clock edges of the delayed clock CKd (e.g. the positive edges of the delayed clock CKd). The SR latch 418 has a first input terminal S (i.e. a set terminal), a second input terminal R (i.e. a reset terminal), and an output terminal Q. The first terminal S is utilized for receiving the first clock edge signal $CK_{edge}$, the second input terminal R is utilized for receiving the second clock edge signal $CKd_{edge}$, and the output terminal Q is utilized for outputting a SR latch output signal $S_{latch}$; however, this is for illustrative purposes only. Any other latch which is able to achieve the same objective also belongs to the scope of the present invention.

The logic circuit 419 is utilized for generating the first mask signal $S_{MASK1}$ according to the SR latch output signal $S_{latch}$ and the first delay control signal $S_{PGATE}$. An inverter 431 may be applied to invert the first delay control signal $S_{PGATE}$ to generate an inverted delay control signal, and then a NOR gate 432 may be applied to perform a NOR operation upon the inverted delay control signal and the SR latch output signal $S_{latch}$ to generate the first mask signal $S_{MASK1}$. Please note this is for illustrative purposes only, and any other logic circuit which is able to achieve the same objective also belongs to the scope of the present invention.

Figure 5:
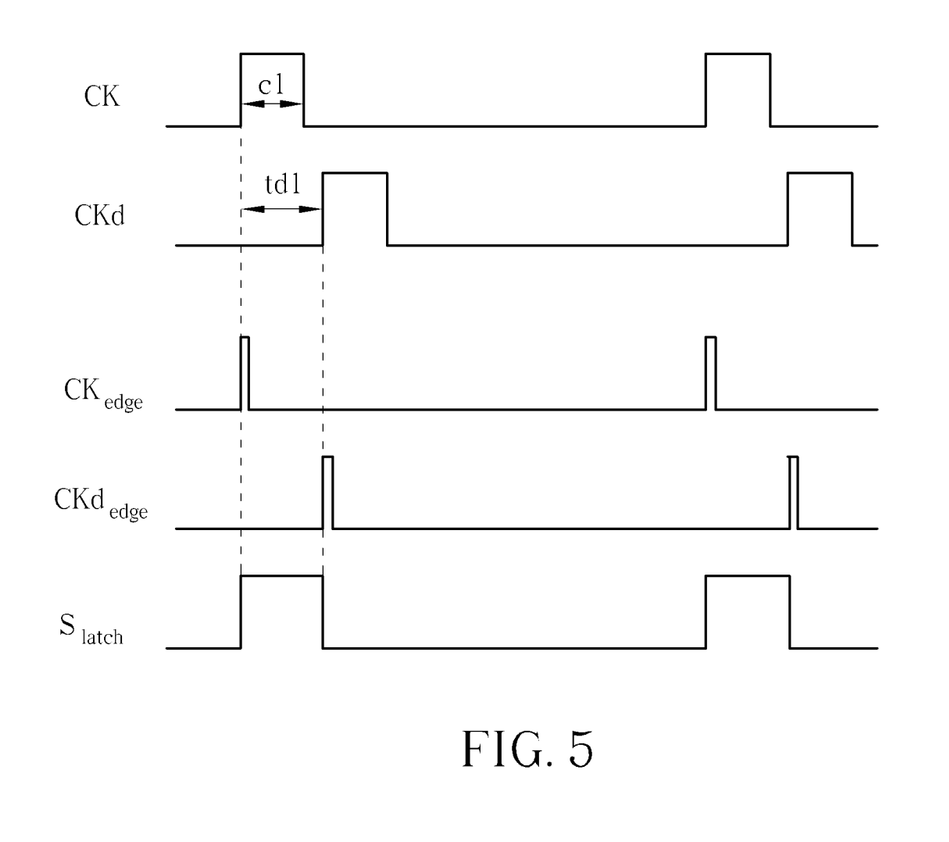
FIG. 5 is a timing diagram illustrating the SR latch output signal according to the input clock which is less than the first timing period.

Please refer to FIG. 5, which is a timing diagram illustrating the SR latch output signal $S_{latch1}$ according to the input clock CK which is less than the first timing period td1. As shown in FIG. 5, a duty cycle c1 of the input clock CK is less than the first time period td1, and the first clock edge generator 414 is utilized to extract the positive edges of the input clock CK to generate the first clock edge signal $CK_{edge}$. Similarly, the second clock edge generator 416 is utilized to extract the positive edges of the delayed clock CKd to generate the second clock edge signal $CKd_{edge}$, wherein there is a time interval equivalent to the first time period td1 between the first clock edge signal $CK_{edge}$ and the second clock edge signal $CKd_{edge}$. The first clock edge signal $CK_{edge}$ and the second clock edge signal $CKd_{edge}$ are inputted to the first input terminal S and the second input terminal R of the SR latch 418 to generate the SR latch output signal $S_{latch}$, which has a duty cycle equal to the first time period td1. The above descriptions only illustrate the operating principles of the delayed circuit 412, the first clock edge generator 414, the second clock edge generator 416, and the SR latch 418. In practice, the input clock CK may not be less than the first time period td1, and the input clock CK may also be equal to or larger than the first time period td1; however, the duty cycle of the SR latch output signal $S_{latch}$ outputted by the SR latch 418 is limited to the first time period td1.

Figure 1:
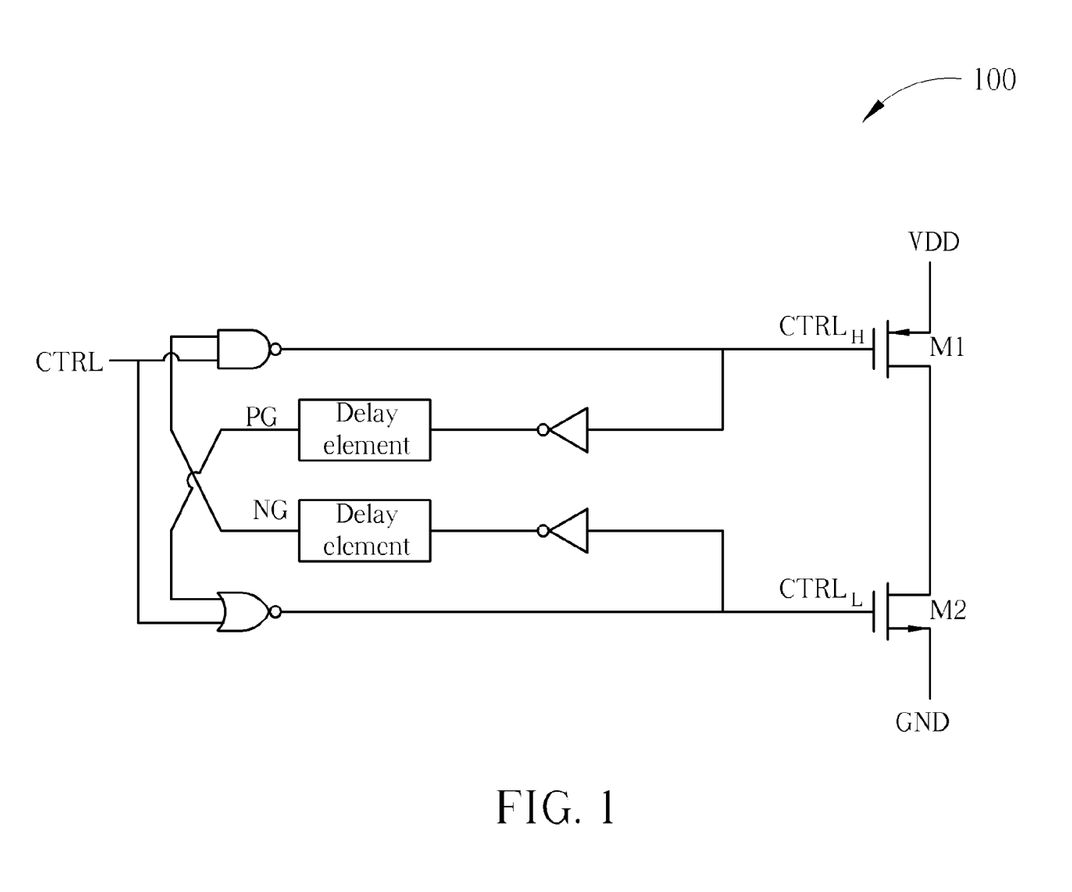
FIG. 1 is a diagram illustrating a conventional push-pull circuit.
Figure 2:
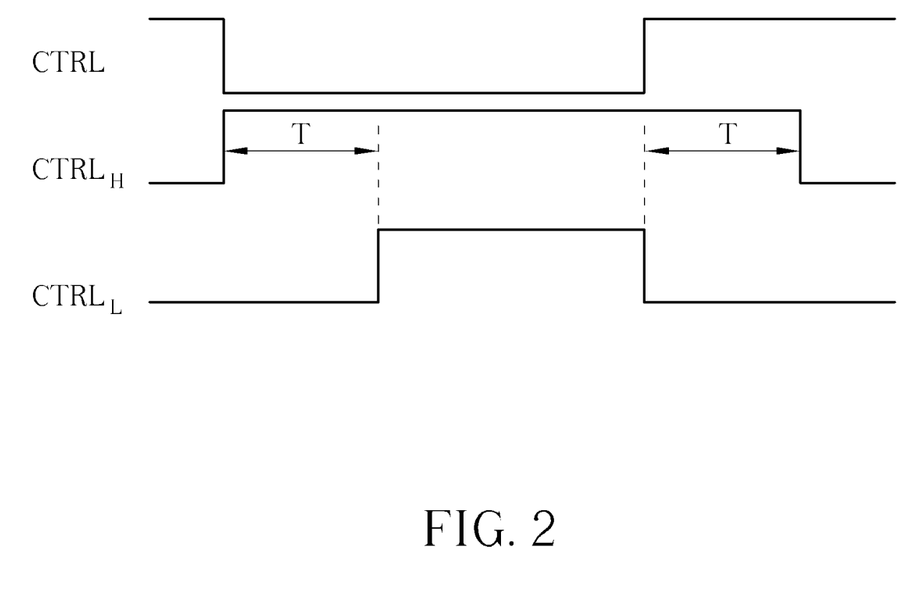
FIG. 2 is a timing chart of the conventional push-pull circuit shown in FIG. 1 in a normal situation.
Figure 3:
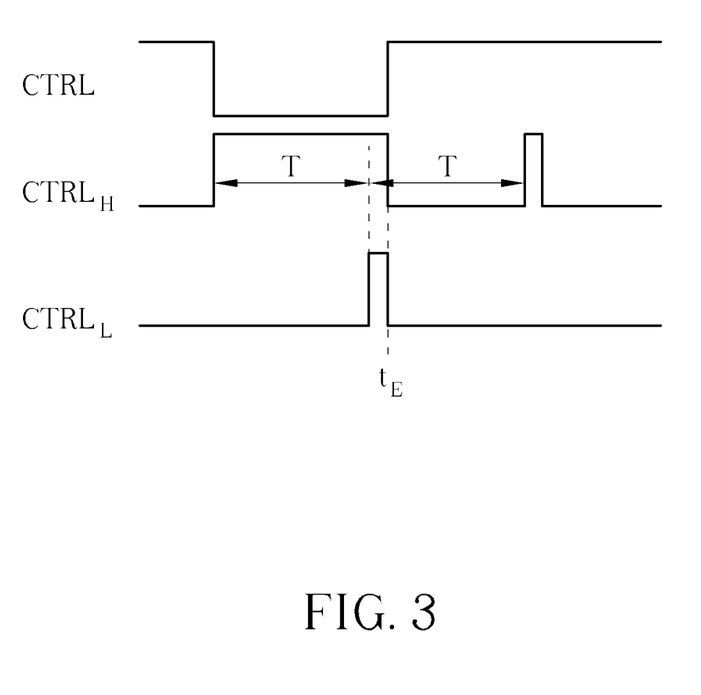
FIG. 3 is a timing chart illustrating disoperation of the conventional push-pull circuit shown in FIG. 1.

The second mask circuit 420 is coupled to the second delay circuit 406 and the inverted input clock CKB, and the second mask circuit 420 is utilized for filtering out the second delay control signal $S_{NGATE\_D}$, which is not larger than a second time period td2, to generate a second mask signal $S_{MASK2}$ according to the inverted input clock CKB. The second mask circuit 420 includes a delay circuit 422, a first clock edge generator 424, a second clock generator 426, a SR latch 428, and a logic circuit 429, wherein the delay time of the delay circuit 422 is the second time period td2. The second mask circuit 420 and the first mask circuit 410 have the same circuit architecture and operation principle, thus the details of the second mask circuit 420 are omitted here for brevity. It should be noted that, in the conventional control circuit applied in the push-pull architecture, the duty cycle of the control signal CTL shown in FIG. 3 must be larger than twice the delay time of the delay element shown in FIG. 1 for avoiding the simultaneous turn on situation shown in FIG. 3. The designer must notice the safe range of the control signal CTRL, since noise or an unsafe control signal CTRL accidentally inputted to the push-pull circuit 100 shown in FIG. 1 may induce excessive current which can burn the circuit. Compared with the conventional design, the safe region is configured in the first mask circuit 410 and the second mask circuit 420 in the present embodiment, wherein the first time period td1 and the second time period td2 should be larger than the summation of the largest delay time of the first delay circuit 404 and the second delay circuit 406 and the largest delay time of the P-type transistor M1 and the N-type transistor M2. Please note that the first time period td1 and the second time period td2 may be configured to be the same value in practice; for instance, the first time period td1 and the second time period td2 may be configured to be a common time period T2. Therefore, noise or disoperation (e.g. a wrong input) can be resisted, and the following high-side or low-side component (i.e. the P-type transistor M1 and the N-type transistor M2) will not be turned on by accident.

The first logic determining circuit 430 of the control circuit 400 is utilized for generating the first control signal $S_{PGATE}$ to the first delay circuit 404 and the P-type transistor M1 according to the second mask signal $S_{MASK2}$ and the input clock CK, and the second logic determining circuit 440 is utilized for generating the second control signal $S_{NGATE}$ to the second delay circuit 406 and the N-type transistor M2 according to the first mask signal $S_{MASK1}$ and the inverted input clock CKB. The first logic determining circuit 430 and the second logic determining circuit 440 may be implemented respectively by the SR latches 432 and 442. For example, in the first logic determining circuit 430, the input clock CK is inputted to a set terminal of the SR latch 432, the second mask signal $S_{MASK2}$ is inputted to a reset terminal of the SR latch 432, and the first control signal $S_{PGATE}$ is generated from an output terminal of the SR latch 432. The operation principle of the second logic determining circuit 440 is basically similar to the first logic determining circuit 430: the first mask signal $S_{MASK1}$ is inputted to a set terminal of the SR latch 442, the inverted input clock CKB is inputted to a reset terminal of the SR latch 442, and the second control signal $S_{NGATE}$ is generated from an output terminal of the SR latch 442. This is for illustrative purposes only; in practice, any other latch which is able to achieve the same objective also belongs to the scope of the present invention.

Figure 6:
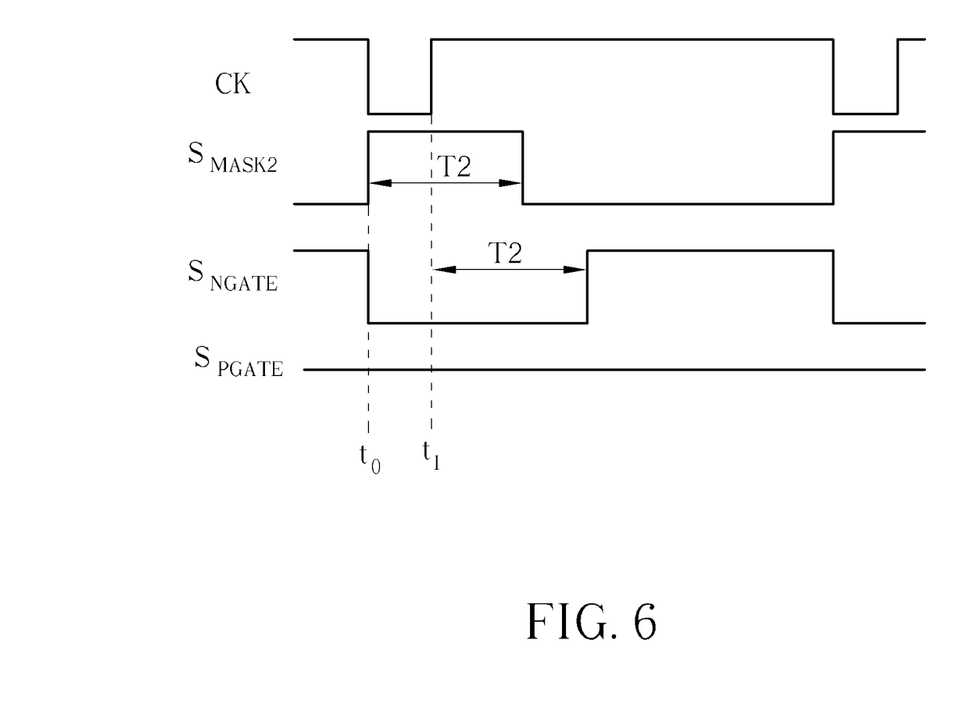
FIG. 6 is a timing chart illustrating the operation of the control circuit in the situation that the negative duty cycle of the input clock is less than the common time period.

Please refer to FIG. 6, which is a timing chart illustrating the operation of the control circuit 400 in the situation that the negative duty cycle of the input clock CK is less than the common time period T2. The input clock CK shown in FIG. 4 goes from 1 to 0 at time $t_0$. In a normal situation, when the control circuit 400 receives such an input, the high-side P-type transistor M1 should be turned on solely to allow the supply voltage VDD to pull up the voltage level thereby driving the following circuit. The input clock CK in FIG. 6 has a negative duty cycle less than the common time period T2, so the input clock CK does not stay at the low voltage level long enough to satisfy the safe range (i.e. the common time period T2), then goes from 0 to 1 at time $t_1$. To prevent disoperation, the first mask circuit 410 masks the input clock CK between time $t_0$ to $t_1$, so that the first control signal $S_{PGATE}$ remains at 1 (the P-type transistor M1 is turned on while the first control signal $S_{PGATE}$ becomes 0), and the second control signal $S_{NGATE}$ still cuts off the N-type transistor M2 at time $t_0$ and turns on the N-type transistor M2 after passing through the common time period T2 after the time $t_1$ (the N-type transistor M2 is turned on while the second control signal $S_{NGATE}$ becomes 1). In the situation that the negative duty cycle of the input clock CK is less than the common time period T2, the first control signal $S_{PGATE}$ remains unchanged, and the second control signal $S_{NGATE}$ still cuts off the N-type transistor M2. The control circuit 400 stops turning on the transistor which should be turned on originally in a risky condition, but the control circuit 400 still cuts off the transistor which should be cut off, to prevent the high-side P-type transistor M1 and the low-side N-type transistor M2 from being turned on simultaneously.

Figure 7:
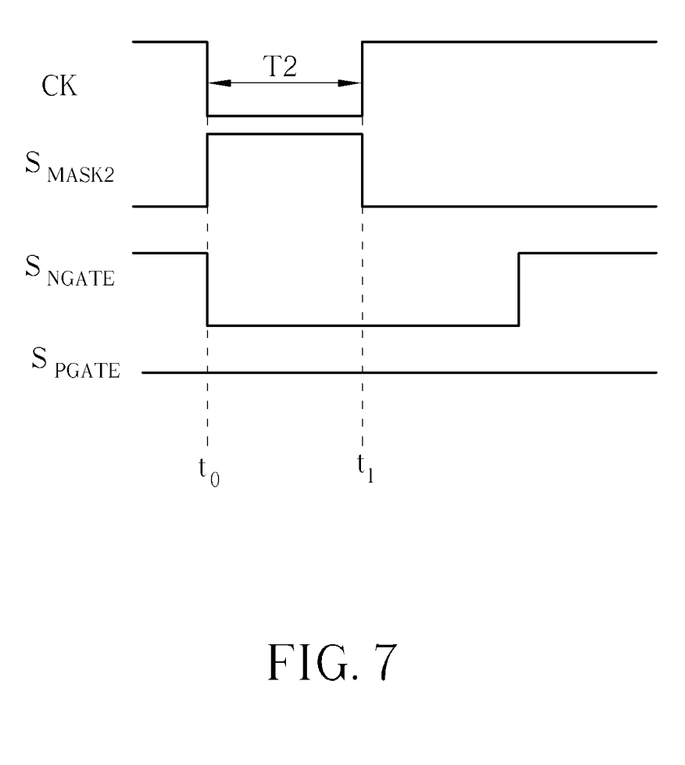
FIG. 7 is a timing chart illustrating the operation of the control circuit in FIG. 4 in the situation that the negative duty cycle of the input clock is equal to the common time period.

Please refer to FIG. 7, which is a timing chart illustrating the operation of the control circuit 400 in FIG. 4 in the situation that the negative duty cycle of the input clock CK is equal to the common time period T2. The input clock CK shown in FIG. 7 has a negative duty cycle exactly equal to the common time period T2; that is, the input clock CK stays at the low voltage level for a time sufficient to meet the safe range (i.e. the common time period T2), then goes from 0 to 1 at time $t_1$. To prevent disoperation, the first mask circuit 410 masks the input clock CK between time $t_0$ to $t_1$, so the first control signal $S_{PGATE}$ remains at 1, and the second control signal $S_{NGATE}$ still cuts off the N-type transistor M2 at time $t_0$ and turns on the N-type transistor M2 after passing through the common time period T2 after the time $t_1$. In the situation where the negative duty cycle of the input clock CK is equal to the common time period T2, the first control signal $S_{PGATE}$ remains unchanged, and the second control signal $S_{NGATE}$ still cuts off the N-type transistor M2.

Figure 8:
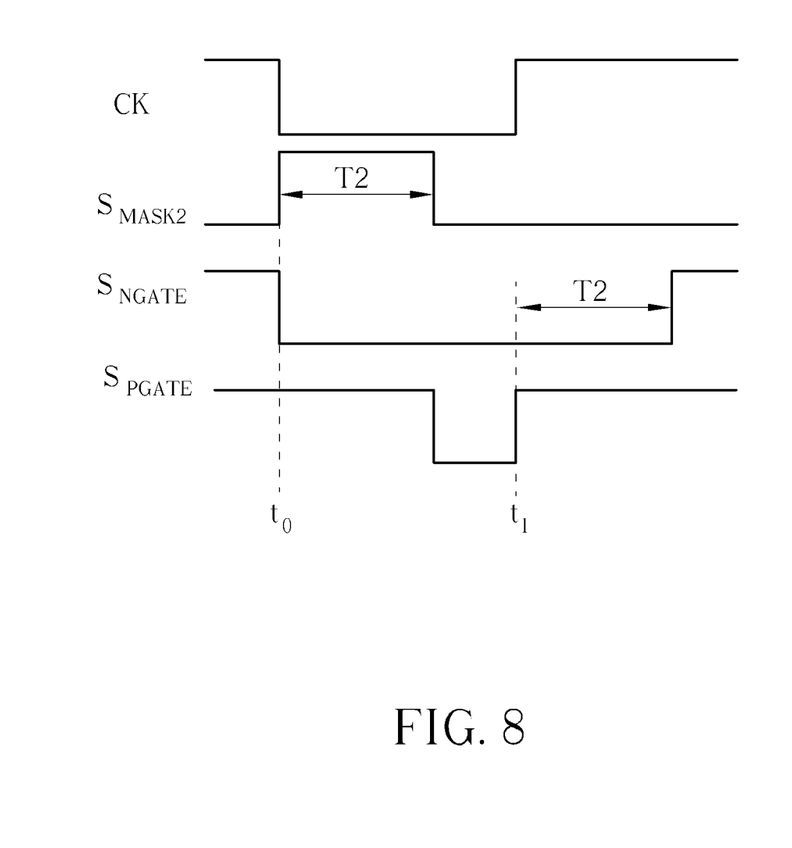
FIG. 8 is a timing chart illustrating the operation of the control circuit in FIG. 4 in the situation that the negative duty cycle of the input clock is larger than the common time period.

Please refer to FIG. 8, which is a timing chart illustrating the operation of the control circuit 400 in FIG. 4 in the situation that the negative duty cycle of the input clock CK is larger than the common time period T2. The input clock CK shown in FIG. 8 has a negative duty cycle larger than the common time period T2; that is, the input clock CK stays at the low voltage level for a time long enough to satisfy the safe range (i.e. the common time period T2), and then goes from 0 to 1 at time $t_1$. Thus, the first mask circuit 410 does not mask the input clock CK between time $t_0$ to $t_1$. The second control signal $S_{NGATE}$ cuts off the N-type transistor M2 at time $t_0$ and turns on the N-type transistor M2 after passing through the common time period T2 after the time $t_1$, and the first control signal $S_{PGATE}$ turns on the high-side P-type transistor M1 after passing through the common time period T2 after the time $t_0$ and cuts off the high-side P-type transistor M1 immediately at time $t_1$ (i.e. when the input clock CK goes from 0 to 1). In the situation where the negative duty cycle of the input clock CK is larger than the common time period T2, the first control signal $S_{PGATE}$ responds to the control of the input clock CK, and the second control signal $S_{NGATE}$ turns on the N-type transistor M2 after passing through the common time period T2 after the P-type transistor M1 is cut off to prevent the high-side P-type transistor M1 and the low-side N-type transistor M2 from being turned on simultaneously.

Figure 9:
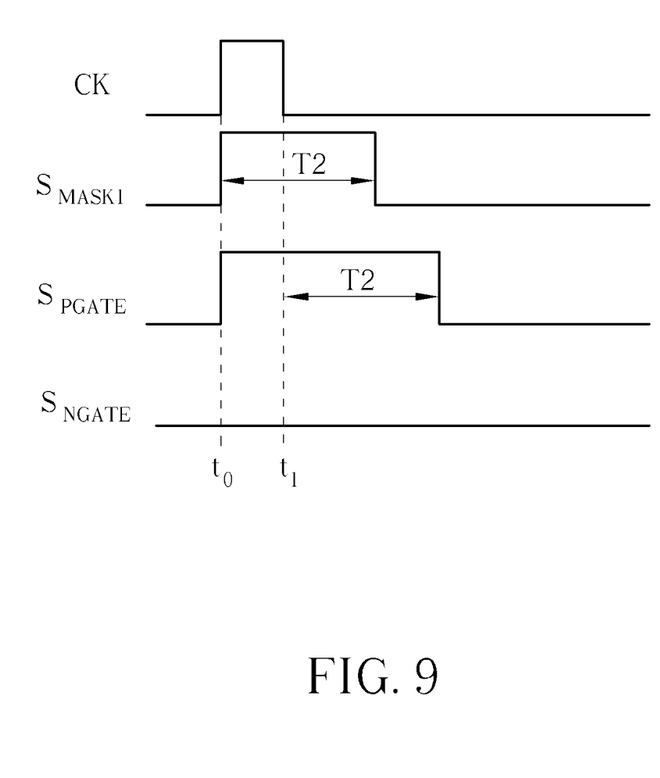
FIG. 9 is a timing chart illustrating the operation of the control circuit in FIG. 4 in the situation that the positive duty cycle of the input clock is less than the common time period.

Please refer to FIG. 9, which is a timing chart illustrating the operation of the control circuit 400 in FIG. 4 in the situation that the positive duty cycle of the input clock CK is less than the common time period T2. The input clock CK shown in FIG. 4 goes from 0 to 1 at time $t_0$. In a normal situation, when the control circuit 400 receives such an input, the low-side N-type transistor M2 is turned on to allow the ground voltage GND to pull down the voltage level thereby driving the following circuit; however, the input clock CK in FIG. 9 has a positive duty cycle less than the common time period T2. The input clock CK does not stay at the high voltage level long enough to satisfy the safe range (i.e. the common time period T2), and then goes from 1 to 0 at time $t_1$. To prevent disoperation, the second mask circuit 420 masks the input clock CK between time $t_0$ to $t_1$, so the second control signal $S_{NGATE}$ remains at 0 (the N-type transistor M2 is turned on while the second control signal $S_{NGATE}$ becomes 1), and the first control signal $S_{PGATE}$ still cuts off the P-type transistor M1 at time $t_0$ and turns on the P-type transistor M1 after passing through the common time period T2 after the time $t_1$ (the P-type transistor M1 is turned on while the first control signal $S_{PGATE}$ becomes 0). In the situation where the positive duty cycle of the input clock CK is less than the common time period T2, the second control signal $S_{NGATE}$ remains unchanged, and the first control signal $S_{PGATE}$ still cuts off the P-type transistor M1; that is, the control circuit 400 stops turning on the transistor which should be turned on originally in a risky condition, but the control circuit 400 still cuts off the transistor which should be cut off, for preventing the high-side P-type transistor M1 and the low-side N-type transistor M2 from being turned on simultaneously.

Figure 10:
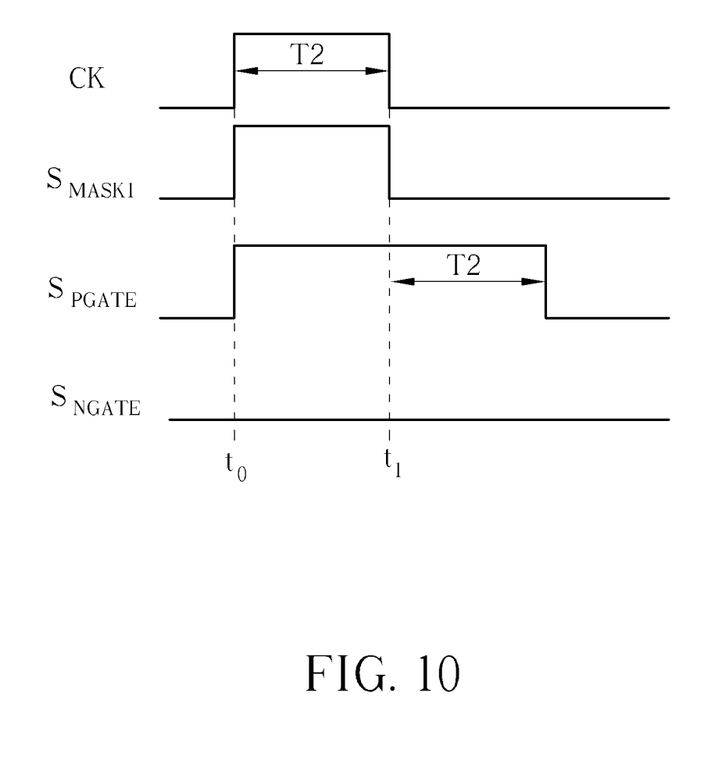
FIG. 10 is a timing chart illustrating the operation of the control circuit in FIG. 4 in the situation that the positive duty cycle of the input clock is equal to the common time period.

Please refer to FIG. 10, which is a timing chart illustrating the operation of the control circuit 400 in FIG. 4 in the situation where the positive duty cycle of the input clock CK is equal to the common time period T2. The input clock CK shown in FIG. 10 has a positive duty cycle exactly equal to the common time period T2; that is, the input clock CK stays at the high voltage level for a time sufficient to meet the safe range (i.e. the common time period T2), and then goes from 1 to 0 at time $t_1$. To prevent disoperation, the second mask circuit 420 masks the input clock CK between time $t_0$ to $t_1$. The second control signal $S_{NGATE}$ remains at 0, and the first control signal $S_{PGATE}$ still cuts off the P-type transistor M1 at time $t_0$ and turns on the P-type transistor M1 after passing through the common time period T2 after the time $t_1$. In the situation where the positive duty cycle of the input clock CK is equal to the common time period T2, the second control signal $S_{NGATE}$ remains unchanged, and the first control signal $S_{PGATE}$ still cuts off the P-type transistor M1.

Figure 11:
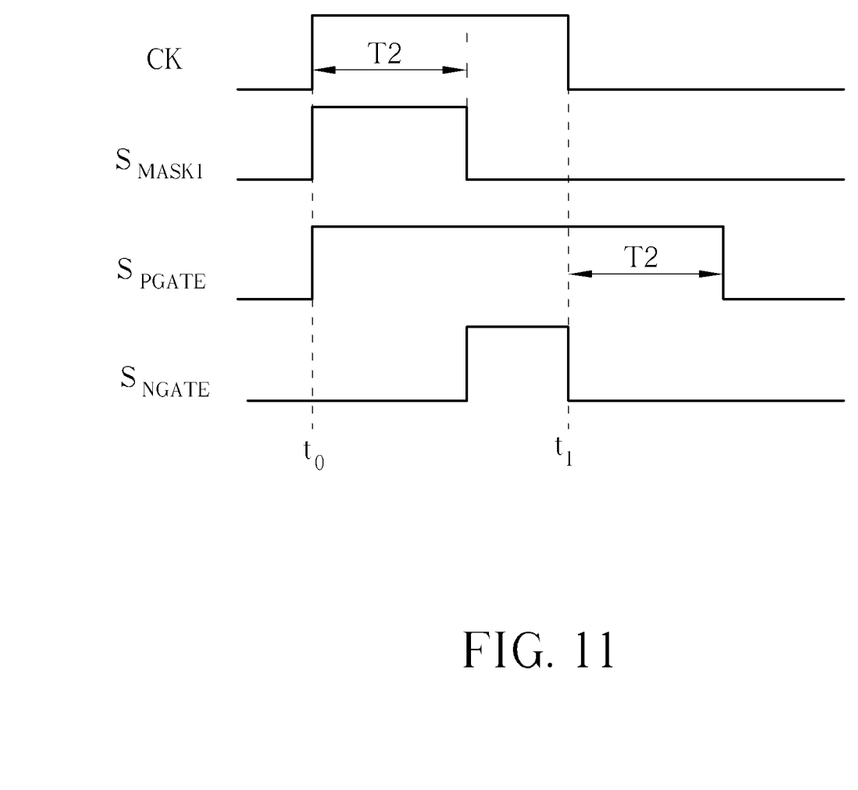
FIG. 11 is a timing chart illustrating the operation of the control circuit in FIG. 4 in the situation that the positive duty cycle of the input clock is larger than the common time period.

Please refer to FIG. 11, which is a timing chart illustrating the operation of the control circuit 400 in FIG. 4 in the situation where the positive duty cycle of the input clock CK is larger than the common time period T2. The input clock CK shown in FIG. 11 has a positive duty cycle larger than the common time period T2; that is, the input clock CK stays at the high voltage level for a time long enough to satisfy the safe range (i.e. the common time period T2), and then goes from 1 to 0 at time $t_1$. Thus, the second mask circuit 420 does not mask the input clock CK between time $t_0$ to $t_1$. The first control signal $S_{PGATE}$ cuts off the P-type transistor M1 at time $t_0$ and turns on the P-type transistor M1 after passing through the common time period T2 after the time $t_1$, and the second control signal $S_{NGATE}$ turns on the low-side N-type transistor M2 after passing through the common time period T2 after the time $t_0$ and cuts off the low-side N-type transistor M2 immediately at time $t_1$ (i.e. when the input clock CK goes from 1 to 0). In the situation where the positive duty cycle of the input clock CK is larger than the common time period T2, the second control signal $S_{NGATE}$ responds to the control of the input clock CK, and the first control signal $S_{PGATE}$ turns on the P-type transistor M1 after passing through the common time period T2 after the N-type transistor M2 is cut off for preventing the high-side P-type transistor M1 and the low-side N-type transistor M2 from being turned on simultaneously.

Compared with the conventional control circuit of the push-pull circuit, the disclosed control circuit is based on the spirit of the mask circuit. In a risky situation, the control circuit stops turning on the transistor which should be turned on originally and still cuts off the transistor which should be cut off for preventing the high-side P-type transistor M1 and the low-side N-type transistor M2 from being turned on simultaneously. This protects the circuit from being burned and achieves the objective of active protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit for generating a first control signal and a second control signal, comprising:
    an inverter, arranged for inverting an input clock to generate an inverted clock;
    a first delay circuit, arranged for delaying the first control signal to generate a first delay control signal;
    a second delay circuit, arranged for delaying the second control signal to generate a second delay control signal;
    a first mask circuit, coupled to the first delay circuit and the input clock, arranged for filtering out the first delay control signal not larger than a first time period to generate a first mask signal according to the input clock;
    a second mask circuit, coupled to the second delay circuit and the inverted input clock, arranged for filtering out the second delay control signal not larger than a second time period to generate a second mask signal according to the inverted input clock;
    a first logic determining circuit, arranged for generating the first control signal to the first delay circuit according to the second mask signal and the input clock; and
    a second logic determining circuit, arranged for generating the second control signal to the second delay circuit according to the first mask signal and the inverted input clock;
    wherein the first control signal is further transmitted to a gate of a P-type transistor, the second control signal is further transmitted to a gate of an N-type transistor, and the first time period and the second time period are larger than a summation of a largest delay time of the first delay circuit and the second delay circuit and a largest delay time of the P-type transistor and the N-type transistor.

2. The control circuit of claim 1, wherein a delay time of the first delay circuit is larger than a delay time of the P-type transistor, and a delay time of the second delay circuit is larger than a delay time of the N-type transistor.

3. A control circuit for generating a first control signal and a second control signal, comprising:
    an inverter, arranged for inverting an input clock to generate an inverted clock;
    a first delay circuit, arranged for delaying the first control signal to generate a first delay control signal;
    a second delay circuit, arranged for delaying the second control signal to generate a second delay control signal;
    a first mask circuit, coupled to the first delay circuit and the input clock, arranged for filtering out the first delay control signal not larger than a first time period to generate a first mask signal according to the input clock, wherein the first mask circuit comprises:
        a delay circuit, arranged for delaying the first time period of the input clock to generate a delayed clock;
        a first clock edge generator, arranged for generating a first clock edge signal according to specific clock edges of the input clock;
        a second clock edge generator, arranged for generating a second clock edge signal according to specific clock edges of the delayed clock;
        a latch, having a first input terminal, a second input terminal, and an output terminal, wherein the first input terminal is arranged for receiving the first clock edge signal, the second input terminal is arranged for receiving the second clock edge signal, and the output terminal is arranged for outputting a latch output signal; and
        a logic circuit, arranged for generating the first mask signal according to the latch output signal and the first delay control signal;
    a second mask circuit, coupled to the second delay circuit and the inverted input clock, arranged for filtering out the second delay control signal not larger than a second time period to generate a second mask signal according to the inverted input clock;
    a first logic determining circuit, arranged for generating the first control signal to the first delay circuit according to the second mask signal and the input clock; and
    a second logic determining circuit, arranged for generating the second control signal to the second delay circuit according to the first mask signal and the inverted input clock.

4. The control circuit of claim 3, wherein the latch is an SR latch, the first input terminal is a set terminal, and the second input terminal is a reset terminal.

5. The control circuit of claim 3, wherein the logic circuit comprises:
    an inverter, arranged for inverting the first delay control signal to generate an inverted delay control signal; and a NOR gate, arranged for performing a NOR operation upon the inverted delay control signal and the latch output signal to generate the first mask signal.

6. A control circuit for generating a first control signal and a second control signal, comprising:
- an inverter, arranged for inverting an input clock to generate an inverted clock;
- a first delay circuit, arranged for delaying the first control signal to generate a first delay control signal;
- a second delay circuit, arranged for delaying the second control signal to generate a second delay control signal;
- a first mask circuit, coupled to the first delay circuit and the input clock, arranged for filtering out the first delay control signal not larger than a first time period to generate a first mask signal according to the input clock;
- a second mask circuit, coupled to the second delay circuit and the inverted input clock, arranged for filtering out the second delay control signal not larger than a second time period to generate a second mask signal according to the inverted input clock;
- a first logic determining circuit, arranged for generating the first control signal to the first delay circuit according to the second mask signal and the input clock, wherein the first logic determining circuit comprises:
    - a latch, having a first input terminal, a second input terminal, and a first output terminal, wherein the first input terminal is arranged for receiving the input clock, the second input terminal is arranged for receiving the second mask signal, and the output terminal is arranged for outputting the first control signal; and
- a second logic determining circuit, arranged for generating the second control signal to the second delay circuit according to the first mask signal and the inverted input clock.

7. The control circuit of claim 6, wherein the latch is an SR latch, the first input terminal is a set terminal, and the second input terminal is a reset terminal.

8. A control method for generating a first control signal and a second control signal, comprising:
- inverting an input clock to generate an inverted clock;
- delaying the first control signal to generate a first delay control signal;
- delaying the second control signal to generate a second delay control signal;
- filtering out the first delay control signal not larger than a first time period to generate a first mask signal according to the input clock;
- filtering out the second delay control signal not larger than a second time period to generate a second mask signal according to the inverted input clock;
- generating the first control signal according to the second mask signal and the input clock;
- generating the second control signal according to the first mask signal and the inverted input clock;
- transmitting the first control signal to a gate of a P-type transistor; and
- transmitting the second control signal to a gate of an N-type transistor;
- wherein the first time period and the second time period are larger than a summation of a largest delay time of the first control signal and the second control signal and a largest delay time of the P-type transistor and the N-type transistor.

9. The control method of claim 8, wherein a delay time of the first control signal is larger than a delay time of the P-type transistor, and a delay time of the second control signal is larger than a delay time of the N-type transistor.

* * * * *